United States Patent
Miyamoto et al.

(10) Patent No.: US 9,276,126 B2
(45) Date of Patent: Mar. 1, 2016

(54) SEMICONDUCTOR DEVICE AND METHOD FOR PRODUCING SAME

(71) Applicant: Sharp Kabushiki Kaisha, Osaka-shi, Osaka (JP)

(72) Inventors: Tadayoshi Miyamoto, Osaka (JP); Kazuatsu Ito, Osaka (JP); Shigeyasu Mori, Osaka (JP); Mitsunobu Miyamoto, Osaka (JP); Yasuyuki Ogawa, Osaka (JP); Makoto Nakazawa, Osaka (JP); Seiichi Uchida, Osaka (JP); Takuya Matsuo, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/375,914

(22) PCT Filed: Jan. 24, 2013

(86) PCT No.: PCT/JP2013/051417
§ 371 (c)(1),
(2) Date: Sep. 26, 2014

(87) PCT Pub. No.: WO2013/115051
PCT Pub. Date: Aug. 8, 2013

(65) Prior Publication Data
US 2015/0041800 A1 Feb. 12, 2015

(30) Foreign Application Priority Data
Jan. 31, 2012 (JP) ................................. 2012-018753

(51) Int. Cl.
*H01L 29/12* (2006.01)
*H01L 29/786* (2006.01)
(Continued)

(52) U.S. Cl.
CPC .......... *H01L 29/7869* (2013.01); *G02F 1/1368* (2013.01); *H01L 27/1225* (2013.01);
(Continued)

(58) Field of Classification Search
USPC ........................................... 257/43
See application file for complete search history.

(56) References Cited

U.S. PATENT DOCUMENTS

| | | | |
|---|---|---|---|
| 2007/0090403 A1* | 4/2007 | Ahn ..................... | G02F 1/13458 257/211 |
| 2008/0035920 A1 | 2/2008 | Takechi et al. | |

(Continued)

FOREIGN PATENT DOCUMENTS

| | | |
|---|---|---|
| JP | 7-245405 A | 9/1995 |
| JP | 2008-40343 A | 2/2008 |

(Continued)

OTHER PUBLICATIONS

Official Communication issued in International Patent Application No. PCT/JP2013/051417, mailed on Apr. 16, 2013.

*Primary Examiner* — Cuong Q Nguyen
*Assistant Examiner* — Nishath Yasmeen
(74) *Attorney, Agent, or Firm* — Keating & Bennett, LLP

(57) ABSTRACT

This semiconductor device (100A) includes: a substrate (1); a gate electrode (3) and a first transparent electrode (2) which are formed on the substrate (1); a first insulating layer (4) formed over the gate electrode (3) and the first transparent electrode (2); an oxide semiconductor layer (5) formed on the first insulating layer (4); source and drain electrodes (6s, 6d) electrically connected to the oxide semiconductor layer (5); and a second transparent electrode (7) electrically connected to the drain electrode (6d). At least a portion of the first transparent electrode (2) overlaps with the second transparent electrode (7) with the first insulating layer (4) interposed between them, and the oxide semiconductor layer (5) and the second transparent electrode (7) are formed out of the same oxide film.

7 Claims, 5 Drawing Sheets

(51) Int. Cl.
  *G02F 1/1368* (2006.01)
  *H01L 29/49* (2006.01)
  *H01L 27/12* (2006.01)
  *H01L 29/45* (2006.01)
  *H01L 29/66* (2006.01)

(52) U.S. Cl.
  CPC ............ *H01L 27/1259* (2013.01); *H01L 29/45* (2013.01); *H01L 29/4908* (2013.01); *H01L 29/66969* (2013.01); *H01L 29/78693* (2013.01); *G02F 2201/40* (2013.01); *G02F 2202/10* (2013.01)

(56) References Cited

U.S. PATENT DOCUMENTS

| | | |
|---|---|---|
| 2010/0220254 A1 | 9/2010 | Liu et al. |
| 2011/0050551 A1 | 3/2011 | Ota et al. |
| 2011/0108831 A1* | 5/2011 | Jeong .................. H01L 27/3248 257/43 |
| 2012/0097940 A1* | 4/2012 | Kwon .................. H01L 27/124 257/43 |
| 2012/0108018 A1* | 5/2012 | Okabe ................. H01L 27/1225 438/158 |
| 2012/0138922 A1 | 6/2012 | Yamazaki et al. |
| 2012/0184060 A1 | 7/2012 | Song et al. |

FOREIGN PATENT DOCUMENTS

| | | | |
|---|---|---|---|
| JP | 2010-204656 A | 9/2010 | |
| JP | 2011-053443 A | 3/2011 | |
| JP | 2011-091279 A | 5/2011 | |
| JP | 2012-134475 A | 7/2012 | |
| WO | 2011/010415 A1 | 1/2011 | |
| WO | WO2011010415 * | 1/2011 | ............ G02F 1/1368 |
| WO | 2011/134390 A1 | 11/2011 | |
| WO | 2012/053415 A1 | 4/2012 | |

* cited by examiner (a)

(b)

(c)

(a)

(b)

(a)

(b)

(c)

(d)

(e)

(f)

SEMICONDUCTOR DEVICE AND METHOD FOR PRODUCING SAME

TECHNICAL FIELD

The present invention relates to a semiconductor device which has been formed using an oxide semiconductor and a method for fabricating such a device, and more particularly relates to an active-matrix substrate for use in a liquid crystal display device or an organic EL display device and a method for fabricating such a substrate. In this description, the "semiconductor devices" include an active-matrix substrate and a display device which uses the active-matrix substrate.

BACKGROUND ART

An active-matrix substrate for use in a liquid crystal display device and other devices includes switching elements such as thin-film transistors (which will be simply referred to herein as "TFTs"), each of which is provided for an associated one of pixels. An active-matrix substrate including TFTs as switching elements is called a "TFT substrate".

As for TFTs, a TFT which uses an amorphous silicon film as its active layer (and will be referred to herein as an "amorphous silicon TFT") and a TFT which uses a polysilicon film as its active layer (and will be referred to herein as a "polysilicon TFT") have been used extensively.

Recently, people have proposed that an oxide semiconductor be used as a material for the active layer of a TFT instead of amorphous silicon or polysilicon. Such a TFT will be referred to herein as an "oxide semiconductor TFT". Since an oxide semiconductor has higher mobility than amorphous silicon, the oxide semiconductor TFT can operate at higher speeds than an amorphous silicon TFT. Also, such an oxide semiconductor film can be formed by a simpler process than a polysilicon film.

Patent Document No. 1 discloses a method for fabricating a TFT substrate including oxide semiconductor TFTs. According to the method disclosed in Patent Document No. 1, a TFT substrate can be fabricated in a reduced number of manufacturing process steps by forming a pixel electrode with the resistance of the oxide semiconductor layer locally decreased.

Recently, as the definition of liquid crystal display devices and other devices has become higher and higher, a decrease in pixel aperture ratio has become an increasingly serious problem. In this description, the "pixel aperture ratio" refers herein to the ratio of the combined area of pixels (e.g., the combined area of regions which transmit light that contributes to a display operation in a transmissive liquid crystal display device) to the overall display area. In the following description, the "pixel aperture ratio" will be simply referred to herein as an "aperture ratio".

Among other things, a medium to small sized transmissive liquid crystal display device to be used in a mobile electronic device has so small a display area that each of its pixels naturally has a very small area and the aperture ratio will decrease particularly significantly when the definition is increased. On top of that, if the aperture ratio of a liquid crystal display device to be used in a mobile electronic device decreases, the luminance of the backlight needs to be increased to achieve an intended brightness, thus causing an increase in power dissipation, too.

To achieve a high aperture ratio, the combined area occupied by a TFT, a storage capacitor, and other elements of a non-transparent material in each pixel may be decreased. However, naturally, the TFT and the storage capacitor should have their minimum required size to perform their function. When oxide semiconductor TFTs are used as TFTs, the TFTs can have a smaller size than when amorphous silicon TFTs are used, which is advantageous. It should be noted that in order to maintain a voltage that has been applied to the liquid crystal layer of a pixel (which is called a "liquid crystal capacitor" electrically), the "storage capacitor" is provided electrically in parallel with the liquid crystal capacitor. In general, at least a portion of the storage capacitor is arranged so as to overlap with the pixel.

CITATION LIST

Patent Literature

Patent Document No. 1: Japanese Laid-Open Patent Publication No. 2011-91279

SUMMARY OF INVENTION

Technical Problem

However, demands for increased aperture ratios are too huge to satisfy just by using oxide semiconductor TFTs. Meanwhile, as the prices of display devices have become lower and lower year after year, development of a technology for manufacturing high-aperture-ratio display devices at a lower cost is awaited.

Thus, a primary object of an embodiment of the present invention is to provide a TFT substrate which can be fabricated by a simpler process and which can contribute to realizing a display device with higher definition and a higher aperture ratio than conventional ones and also provide a method for fabricating such a TFT substrate.

Solution to Problem

A semiconductor device according to an embodiment of the present invention includes: a substrate; a gate electrode and a first transparent electrode which have been formed on the substrate; a first insulating layer which are formed over the gate electrode and the first transparent electrode; an oxide semiconductor layer formed on the first insulating layer; source and drain electrodes electrically connected to the oxide semiconductor layer; and a second transparent electrode electrically connected to the drain electrode. At least a portion of the oxide semiconductor layer overlaps with the gate electrode with the first insulating layer interposed between them, at least a portion of the first transparent electrode overlaps with the second transparent electrode with the first insulating layer interposed between them, and the oxide semiconductor layer and the second transparent electrode are formed out of the same oxide film.

In one embodiment, the drain electrode is formed on the second transparent electrode, and the second transparent electrode contacts directly with the drain electrode.

In one embodiment, the second transparent electrode contains an impurity at a higher concentration than the oxide semiconductor layer.

In one embodiment, the semiconductor device further includes a second insulating layer which is formed between the gate electrode and the substrate and which is formed over the first transparent electrode.

In one embodiment, the semiconductor device further includes a second insulating layer formed over the gate electrode, and the first transparent electrode is formed on the second insulating layer.

[0038] In one embodiment, the semiconductor device further includes an insulating protective layer which is formed over the source and drain electrodes, which is formed to contact with a channel region of the oxide semiconductor layer, and which is made of an oxide.

In one embodiment, the first insulating layer includes an oxide insulating layer, which contacts with the oxide semiconductor layer.

In one embodiment, the oxide film includes In, Ga and Zn.

In one embodiment, the oxide semiconductor layer includes an In—Ga—Zn—O based semiconductor.

A method for fabricating a semiconductor device according to an embodiment of the present invention includes the steps of: (a) providing a substrate; (b) forming a gate electrode and a first transparent electrode on the substrate; (c) forming a first insulating layer over the gate electrode and the first transparent electrode; (d) forming an oxide semiconductor film over the first insulating layer; (e) forming source and drain electrodes on the oxide semiconductor film; and (f) performing a resistance lowering process to lower the resistance of a portion of the oxide semiconductor film, thereby forming a second transparent electrode and turning the rest of the oxide semiconductor film, of which the resistance has not been lowered, into an oxide semiconductor layer, whereby at least a portion of the oxide semiconductor layer overlaps with the gate electrode with the first insulating layer interposed between them, and at least a portion of the second transparent electrode overlaps with the first transparent electrode with the first insulating layer interposed between them.

In one embodiment, the step (f) includes implanting an impurity into the portion of the oxide semiconductor film.

In one embodiment, the step (b) includes forming the first transparent electrode on the substrate, forming a second insulating layer over the first transparent electrode, and then forming the gate electrode on the second insulating layer.

In one embodiment, the step (b) includes forming the gate electrode on the substrate, forming a second insulating layer over the gate electrode, and then forming the first transparent electrode on the second insulating layer.

In one embodiment, the step (f) includes the step (f2) of forming a protective layer to protect the channel region of the oxide semiconductor film before performing the resistance lowering process.

In one embodiment, when viewed along a normal to the substrate, an end portion of the protective layer overlaps with the drain electrode.

In one embodiment, the oxide semiconductor film includes an In—Ga—Zn—O based semiconductor.

Advantageous Effects of Invention

An embodiment of the present invention provides a TFT substrate which can be fabricated by a simpler process and which can contribute to realizing a display device with higher definition and a higher aperture ratio than conventional ones and also provides a method for fabricating such a TFT substrate.

DESCRIPTION OF EMBODIMENTS

Hereinafter, a semiconductor device according to an embodiment of the present invention will be described with reference to the accompanying drawings. A semiconductor device according to this embodiment includes a thin-film transistor which has an active layer made of an oxide semiconductor (and which will be referred to herein as an "oxide semiconductor TFT"). A semiconductor device according to this embodiment just needs to include an oxide semiconductor TFT and may be implemented broadly as an active-matrix substrate or any of various kinds of display devices and electronic devices.

In the following description, a semiconductor device according to an embodiment of the present invention will be described as being applied to an oxide semiconductor TFT for use in a liquid crystal display device.

Figure 1:
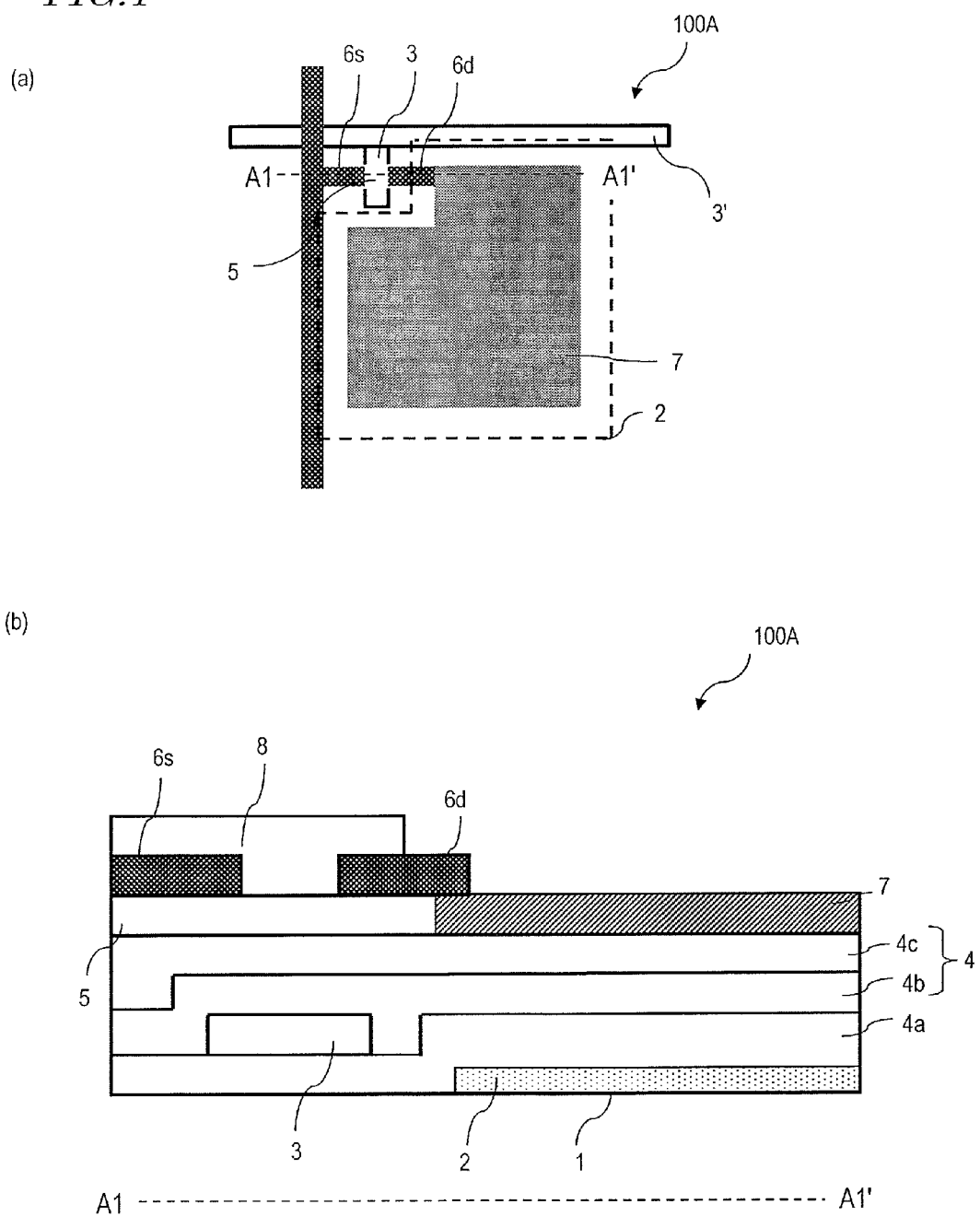
FIG. 1 (a) is a schematic plan view illustrating a TFT substrate 100A according to an embodiment of the present invention and (b) is a schematic cross-sectional view of the TFT substrate 100A as viewed on the plane A1-A1' shown in (a).

FIG. 1(a) is a schematic plan view illustrating a TFT substrate 100A according to this embodiment. FIG. 1(b) is a schematic cross-sectional view of the semiconductor device (TFT substrate) 100A as viewed on the plane A1-A1' shown in FIG. 1(a).

This TFT substrate 100A includes: a substrate 1; a gate electrode 3 and a first transparent electrode 2 which have been formed on the substrate 1; an insulating layer 4 which has been formed over the gate electrode 3 and the first transparent electrode 2; an oxide semiconductor layer 5 which has been formed on the insulating layer 4; source and drain electrodes 6s, 6d which are electrically connected to the oxide semiconductor layer 5; and a second transparent electrode 7 which is electrically connected to the drain electrode 6d. At least a portion of the first transparent electrode 2 overlaps with the second transparent electrode 7 with the insulating layer 4 interposed between them. At least a portion of the oxide semiconductor layer 5 overlaps with the gate electrode 3 with the insulating layer 4 interposed between them. The oxide semiconductor layer 5 and the second transparent electrode 7 are formed out of the same oxide film.

In this TFT substrate 100A, at least a portion of the first transparent electrode 2 overlaps with the second transparent electrode 7 with the insulating layer 4 interposed between them, thereby forming a storage capacitor there. That is why the storage capacitor this TFT substrate 100A has is transparent (i.e., transmits visible light), and therefore, does not decrease the aperture ratio. Consequently, this TFT substrate 100A can have a higher aperture ratio than a TFT substrate, of which the storage capacitor includes a non-transparent electrode that has been formed out of a metal film (i.e., either a gate metal layer or a source metal layer) as in a conventional structure. In addition, since the aperture ratio is not decreased by the storage capacitor, the capacitance value of the storage capacitor (i.e., the area of the storage capacitor) can be increased as needed, which is also beneficial.

Furthermore, it is preferred that the drain electrode 6d be formed on, and contact directly with, the second transparent electrode 7. By adopting such a structure, the second transparent electrode 7 can be extended to reach approximately an end portion of the drain electrode 6d. As a result, this TFT substrate 100A can have a higher aperture ratio than the TFT substrate disclosed in Patent Document No. 1.

In this TFT substrate 100A, a first transparent electrode 2 has been formed on a substrate 1, an insulating layer 4a has been formed over the first transparent electrode 2, and a gate electrode 3 has been formed on the insulating layer 4a. This TFT substrate 100A further includes an insulating protective layer 8 which has been formed over the source and drain electrodes 6s, 6d so as to contact with the channel region of the oxide semiconductor layer 5. The insulating protective layer 8 may be made of an oxide, for example.

Hereinafter, the respective components of this TFT substrate 100A will be described in detail one by one.

The substrate 1 is typically a transparent substrate and may be a glass substrate, for example, but may also be a plastic substrate. Examples of the plastic substrates include a substrate made of either a thermosetting resin or a thermoplastic resin and a composite substrate made of these resins and an inorganic fiber (such as glass fiber or a non-woven fabric of glass fiber). A resin material with thermal resistance may be polyethylene terephthalate (PET), polyethylene naphthalate (PEN), polyether sulfone (PES), an acrylic resin, or a polyimide resin, for example. Also, when used in a reflective liquid crystal display device, the substrate 1 may also be a silicon substrate.

The first transparent electrode 2 has been formed out of a transparent conductive film such as an ITO (indium tin oxide) film or an IZO film. The thickness of the first transparent electrode 2 may fall within the range of 20 nm to 200 nm. In this embodiment, the first transparent electrode 2 has a thickness of about 100 nm.

The gate electrode 3 is electrically connected to a gate line 3'. The gate electrode 3 and the gate line 3' may have a multilayer structure, of which the upper layer is a W (tungsten) layer and the lower layer is a TaN (tantalum nitride) layer, for example. Alternatively, the gate electrode 3 and the gate line 3' may also have a multilayer structure consisting of Mo (molybdenum), Al (aluminum) and Mo layers or may even have a single-layer structure, a double layer structure, or a multilayer structure consisting of four or more layers. Still alternatively, the gate electrode 3a may be made of an element selected from the group consisting of Cu (copper), Al, Cr (chromium), Ta (tantalum), Ti (titanium), Mo and w or an alloy or metal nitride which is comprised mostly of any of these elements. The thickness of the gate electrode 3 may fall within the range of about 50 nm to about 600 nm, for example. In this embodiment, the gate electrode 3 has a thickness of approximately 420 nm.

The insulating layer (gate insulating layer) 4 includes two insulating layers 4b and 4c. The insulating layer 4c suitably includes an oxide insulating layer, which suitably contacts directly with the oxide semiconductor layer 5. If the oxide insulating layer directly contacts with the oxide semiconductor layer 5, oxygen included in the oxide insulating layer will be supplied to the oxide semiconductor layer 5, thus preventing oxygen deficiencies of the oxide semiconductor layer 5 from deteriorating the properties of the semiconductor. The insulating layer 4c may be an $SiO_2$ (silicon dioxide) layer, for example. The insulating layers 4a and 4b may be $SiN_x$ (silicon nitride) layers, for example. In this embodiment, the insulating layer 4a may have a thickness of approximately 100 nm, the insulating layer 4b may have a thickness of approximately 325 nm, the insulating layer 4c may have a thickness of approximately 50 nm, and the gate insulating layer 4 may have an overall thickness of approximately 375 nm, for example. Alternatively, the insulating layer 4a and the gate insulating layer 4 may also be a single layer or a multilayer structure of $SiO_2$ (silicon dioxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$). The thickness of the gate insulating layer 4 suitably falls within the range of about 50 nm to about 600 nm. To prevent impurities from diffusing from the substrate 1, the insulating layers 4a and 4b are suitably made of $SiN_x$ or $SiN_xO_y$ (silicon oxynitride, where x>y). Moreover, to prevent the semiconductor properties of the oxide semiconductor layer 5 from deteriorating, the insulating layer 4c is suitably made of either $SiO_2$ or $SiO_xN_y$ (silicon nitride oxide, where x>y). Furthermore, to form a dense gate insulating layer 4 which causes little gate leakage current at low temperatures, the gate insulating layer 4 is suitably formed using a rare gas of Ar (argon), for example.

The oxide semiconductor layer 5 may include an In—Ga—Zn—O based semiconductor (which will be referred to herein as an "IGZO based semiconductor"), for example. In this case, the IGZO based semiconductor is a ternary oxide of In (indium), Ga (gallium) and Zn (zinc). The ratios (i.e., mole fractions) of In, Ga and Zn are not particularly limited. For example, In:Ga:Zn=2:2:1, In:Ga:Zn=1:1:1 or In:Ga:Zn=1:1:2 may be satisfied. The IGZO based semiconductor may be either amorphous or crystalline. If the IGZO based semiconductor is a crystalline one, a crystalline IGZO based semiconductor of which the c axis is substantially perpendicular to the layer plane is suitably used. The crystal structure of such an IGZO based semiconductor is disclosed, for example, in Japanese Laid-Open Patent Publication No. 2012-134475, the entire disclosure of which is hereby incorporated by reference.

The oxide semiconductor material that makes the oxide semiconductor layer 5 does not have to be an IGZO based semiconductor, but may also be a Zn—O based semiconductor (ZnO), an In—Zn—O based semiconductor (IZO™), a Zn—Ti—O based semiconductor (ZTO), a Cd—Ge—O based semiconductor, a Cd—Pb—O based semiconductor, CdO (cadmium oxide), an Mg—Zn—O based semiconductor, an In—Sn—Zn—O based semiconductor (such as $In_2O_3$—$SnO_2$—ZnO) or an In—Ga—Sn—O based semiconductor, for example. Furthermore, the oxide semiconductor layer 5 may also be ZnO in an amorphous state, a polycrystalline state, or a microcrystalline state (which is a mixture of amorphous and polycrystalline states) to which one or multiple impurity elements selected from the group consisting of Group I, Group XIII, Group XIV, Group XV and Group XVII elements have been added, or may even be ZnO to which no impurity elements have been added at all. If an amorphous oxide semiconductor layer is used as the oxide semiconductor layer 5, the semiconductor device can be fabricated at a low temperature and can achieve high mobility. The oxide semiconductor layer 5 may have a thickness of approximately 50 nm, for example. The thickness of the oxide semiconductor layer 5 may fall within the range of about 30 nm to about 100 nm, for example.

The source and drain electrodes 6s and 6d may have a multilayer structure comprised of Ti, Al and Ti layers, for example. Alternatively, the source and drain electrodes 6s and 6d may also have a multilayer structure comprised of Mo, Al and Mo layers or may even have a single-layer structure, a double layer structure or a multilayer structure consisting of four or more layers. Furthermore, the source and drain electrodes 6s and 6d may also be made of an element selected from the group consisting of Al, Cr, Ta, Ti, Mo and W, or an alloy or metal nitride comprised mostly of any of these elements. The thicknesses of the source and drain electrodes 6s and 6d may fall within the range of about 50 nm to about 600 nm. In this embodiment, the source and drain electrodes 6s and 6d have a thickness of approximately 350 nm, for example.

The insulating protective layer 8 has been formed to contact with the channel region of the oxide semiconductor layer 5. The insulating protective layer 8 is suitably made of an oxide (such as $SiO_2$). If the insulating protective layer 8 is made of an oxide, it is possible to prevent the oxygen deficiencies of the oxide semiconductor layer 5 from deteriorating the semiconductor properties as described above. Alternatively, the insulating protective layer 8b may also be made of SiON (which may be either silicon oxynitride or silicon nitride oxide), $Al_2O_3$ or $Ta_2O_5$, for example. The thickness of the insulating protective layer b may fall within the range of about 50 nm to about 300 nm, for example. In this embodiment, the insulating protective layer 8 has a thickness of about 150 nm, for example.

The second transparent electrode 7 may be a conductive layer including an In—Ga—Zn—O based oxide (which will be referred to herein as an "IGZO based oxide"), for example. The second transparent electrode 7 has a thickness of about 50 nm, for example. The thickness of the second transparent electrode 7 may fall within the range of about 20 nm to about 200 nm, for example. As will be described in detail later, the second transparent electrode 7 and the oxide semiconductor layer 5 are formed out of the same transparent oxide film. If the second transparent electrode 7 and the oxide semiconductor layer 5 are formed out of the same oxide film, the manufacturing process can be simplified and the manufacturing cost can be cut down. As the oxide film, a film including an IGZO based oxide such as an IGZO based semiconductor film may be used, for example. As mentioned above, in this description, an IGZO based oxide with semiconductor properties will be referred to herein as an "IGZO based semiconductor".

As will be described in detail later, the second transparent electrode 7 is doped more heavily with either a p-type impurity (such as B (boron)) or an n-type impurity (such as P (phosphorus)) than the oxide semiconductor layer 5 is.

Figure 2:
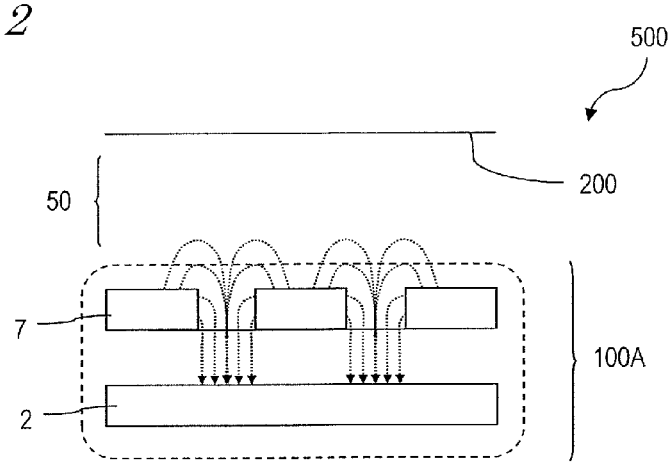
FIG. 2 (a) to (c) are schematic cross-sectional views illustrating liquid crystal display devices each including the TFT substrate 100A.
Figure 2:
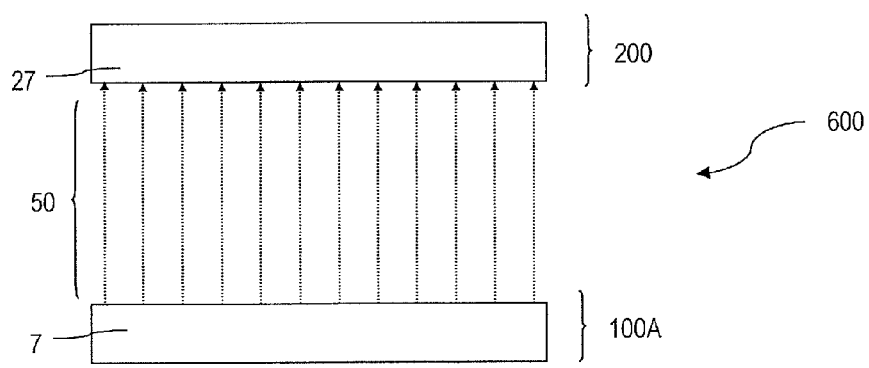
Figure 2:
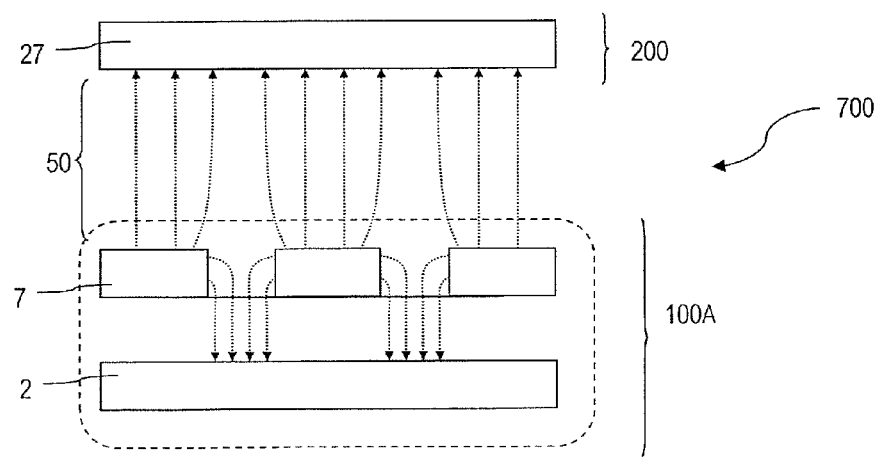

Hereinafter, a liquid crystal display device including such a TFT substrate 100A will be described with reference to FIG. 2. Specifically, FIGS. 2(a) to 2(c) are schematic cross-sectional views of a liquid crystal display device including the TFT substrate 100A. In FIGS. 2(a) to 2(c), the dotted arrows indicate the directions of an electric field.

As shown in FIG. 2(a), the TFT substrate 100A may be used in a fringe field switching (FFS) mode liquid crystal display device 500, for example. In this case, the first transparent electrode 2 that forms the lower layer is used as a common electrode (to which either a common voltage or a counter voltage is applied) and the second transparent electrode 7 that forms the upper layer is used as a pixel electrode (to which a display signal voltage is applied). At least one slit is cut through the second transparent electrode 7. An FFS mode liquid crystal display device with such a configuration is disclosed in Japanese Laid-Open Patent Publication No. 2011-53443, for example, the entire disclosure of which is hereby incorporated by reference.

This liquid crystal display device 500 includes a TFT substrate 100A, a counter substrate 200, and a liquid crystal layer 50 interposed between the TFT substrate 100A and the counter substrate 200. In this liquid crystal display device 500, no counter electrode such as a transparent electrode of ITO, for example, is arranged on the surface of the counter substrate 200 to face the liquid crystal layer 50. Instead, a display operation is carried out by controlling the alignments of liquid crystal molecules in the liquid crystal layer 50 with a lateral electric field which has been generated by the first and second transparent electrodes (i.e., the common electrode and the pixel electrode) 2 and 7 that have been formed on the TFT substrate 100A.

In this TFT substrate 100A, the first transparent electrode (common electrode) 2 is located closer to the substrate 1 than the second transparent electrode (pixel electrode) 7 is. That is why this TFT substrate 100A can be used in not only the FFS mode liquid crystal display device 500 described above but also liquid crystal display devices in any of various other liquid crystal modes as well.

For example, this TFT substrate 100A can be used in a vertical electric field mode liquid crystal display device as shown in FIG. 2(b) in which a counter electrode 27 is arranged on one surface of the counter substrate 200 to face the liquid crystal layer and which conducts a display operation by controlling the alignments of liquid crystal molecules in the liquid crystal layer 50 with a vertical electric field generated by the counter electrode 27 and the second transparent electrode (pixel electrode) 7. In that case, a plurality of slits does not have to be cut through the second transparent electrode 7.

Furthermore, the TFT substrate 100A may also be used in a vertical/lateral electric field mode liquid crystal display device 700 as shown in FIG. 2(c) in which a counter electrode 27 is arranged on one surface of the counter substrate 200 to face the liquid crystal layer and a plurality of slits are cut through the second transparent electrode (pixel electrode) 7 and which conducts a display operation by controlling the alignments of liquid crystal molecules in the liquid crystal layer 50 with a lateral electric field generated by the second transparent electrode (pixel electrode) 7 and the first transparent electrode (common electrode) 2 and with a vertical electric field generated by the second transparent electrode (pixel electrode) 7 and the counter electrode 27. Such a liquid crystal display device 700 is disclosed in PCT International Application Publication No. 2012/053415, for example.

For these reasons, this TFT substrate 100A is applicable more flexibly to various kinds of liquid crystal modes than a TFT substrate of which the pixel electrode is located closer to the substrate than its common electrode is.

Figure 3:
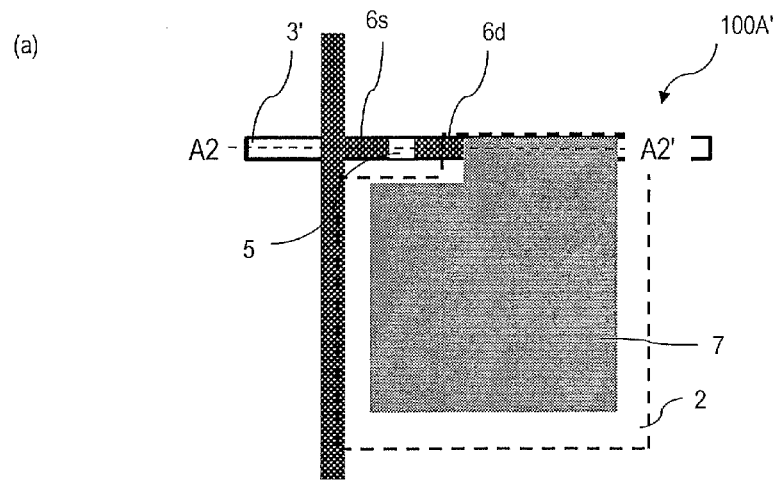
FIG. 3 (a) is a schematic plan view illustrating a TFT substrate 100A' as a modified example. (b) is a schematic cross-sectional view of the TFT substrate 100A' as viewed on the plane A2-A2' shown in (a).
Figure 3:
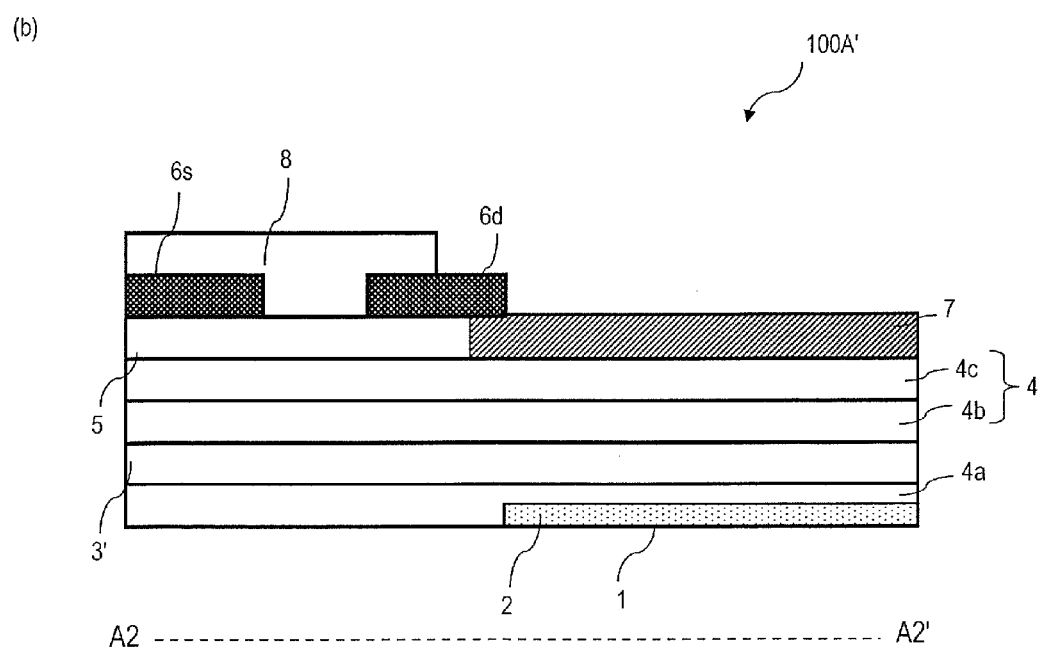

The TFT substrate 100A may be modified into the TFT substrate 100A' shown in FIG. 3. FIG. 3(a) is a schematic plan view illustrating a TFT substrate 100A' as a modified example. FIG. 3(b) is a schematic cross-sectional view of the TFT substrate 100A' as viewed on the plane A2-A2' shown in FIG. 3(a).

The TFT substrate 100A' shown in FIGS. 3(a) and 3(b) includes an oxide semiconductor layer 5 which overlaps with a gate line 3' and has a structure in which when viewed along a normal to the substrate 1, the gate line 3' and the source and drain electrodes 6s, 6d overlap with each other, which is a difference from the TFT substrate 100A. In this TFT substrate 100A', the gate line 3' functions as a gate electrode 3. The TFT substrate 100A' can have an even higher aperture ratio than the TFT substrate 100A.

However, this TFT substrate 100A' has a higher gate-drain parasitic capacitance (Cgd) than the TFT substrate 100A, which is one of drawbacks of the TFT substrate 100A'. As is well known, if the gate-drain parasitic capacitance (Cgd) is large, then the feedthrough voltage rises. The feedthrough voltage would cause an image persistence phenomenon or flickers. To lower the feedthrough voltage, the ratio of the gate-drain parasitic capacitance (Cgd) to the overall capacitance of the pixel (i.e., liquid crystal capacitance Clc+storage capacitance Cs+gate-drain parasitic capacitance Cgd) needs to be decreased. This TFT substrate 100A' has a transparent storage capacitor with a transparent electrode, and therefore, can have its capacitance value increased by increasing the area of the storage capacitor without causing a decrease in aperture ratio. That is to say, even by adopting such a structure in which the gate-drain parasitic capacitance (Cgd) becomes as high as in this TFT substrate 100A', the feedthrough voltage can be reduced sufficiently.

Moreover, if a pixel's overall capacitance is large, it means that a lot of electric charges are needed to apply a predetermined voltage to the pixel. This TFT substrate 100A' includes oxide semiconductor TFTs which have higher current supplying ability than conventional amorphous silicon TFTs. That is why the display quality will never be debased by an increase in the pixel's capacitance.

Next, it will be described how to fabricate the TFT substrate 100A.

A method for fabricating a semiconductor device according to an embodiment of the present invention includes the steps of: (a) providing a substrate 1; (b) forming a gate electrode 3 and a first transparent electrode 2 on the substrate 1; (c) forming a first insulating layer 4b and/or 4c over the gate electrode 3 and the first transparent electrode 2; (d) forming an oxide semiconductor film 5' over the first insulating layer 4b and/or 4c; (e) forming source and drain electrodes 6s and 6d on the oxide semiconductor film 5'; and (f) performing a resistance lowering process L to lower the resistance of a portion of the oxide semiconductor film 5', thereby forming a second transparent electrode 7 and turning the rest of the oxide semiconductor film 5', of which the resistance has not been lowered, into an oxide semiconductor layer 5, whereby at least a portion of the oxide semiconductor layer 5 overlaps with the gate electrode 3 with the insulating layer 4 interposed between them, and at least a portion of the second transparent electrode 7 overlaps with the first transparent electrode 3 with the insulating layer 4 interposed between them.

Such a method for fabricating a semiconductor device is a simplified one, and therefore, can contribute to cutting down the manufacturing cost.

Figure 4:
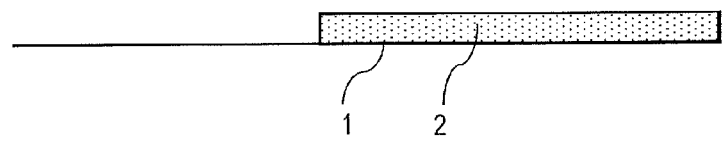
FIG. 4 (a) through (f) are schematic cross-sectional views illustrating an exemplary manufacturing process for fabricating a TFT substrate 100A according to an embodiment of the present invention.
Figure 4:
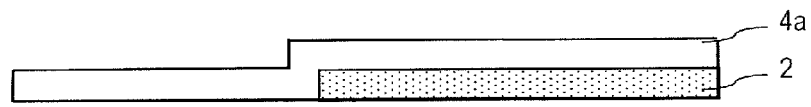
Figure 4:
Figure 4:
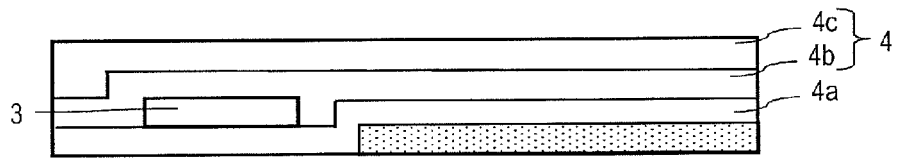
Figure 4:
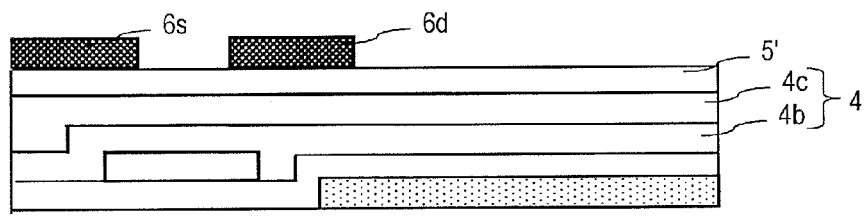
Figure 4:
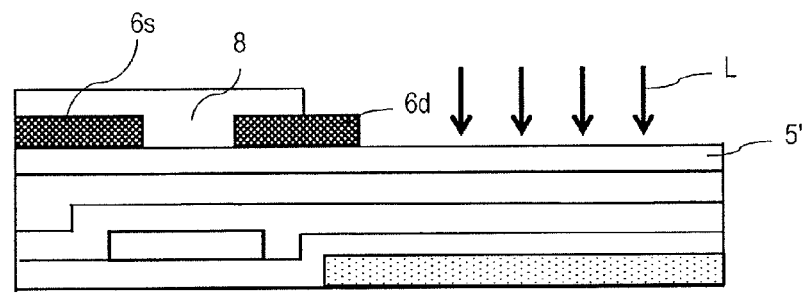

Hereinafter, an exemplary method for fabricating the TFT substrate 100A will be described in detail with reference to FIG. 4.

FIGS. 4(a) through 4(f) are schematic cross-sectional views illustrating an exemplary method for fabricating the TFT substrate 100A.

First of all, as shown in FIG. 4(a), a first transparent electrode 2 is formed on a substrate 1. As the substrate 1, a transparent insulating substrate such as a glass substrate, for example, may be used. The first transparent electrode 2 may be formed by a known method such as a sputtering process. The first transparent electrode 2 may be made of ITO, for example, and may have a thickness of about 100 nm.

Next, as shown in FIG. 4(b), an insulating layer 4a is deposited over the first transparent electrode 2 by CVD (chemical vapor deposition) process or any other suitable method. The insulating layer 4a may be made of $SiN_x$, for example, and may have a thickness of about 100 nm.

Subsequently, as shown in FIG. 4(c), a gate electrode 3 is formed on the insulating layer 4a. The gate electrode 3 may be formed by depositing a conductive film on the insulating layer 4a by sputtering process and then patterning the conductive film by photolithographic process. It should be noted that when viewed along a normal to the substrate 1, the gate electrode 3 and the first transparent electrode 2 do not overlap with each other. In this example, a multilayer film with a double layer structure consisting of a TaN film (with a thickness of about 50 nm) and a W film (with a thickness of about 370 nm) that have been stacked one upon the other in this order on the substrate 1 is used as the conductive film. As this first conductive film, a single-layer film of Ti, Mo, Ta, W, Cu, Al or Cr, a multilayer film or alloy film including any of these elements in combination, or a metal nitride film thereof may be used.

Next, as shown in FIG. 4(d), insulating layers 4b and 4c are formed by CVD process to cover the gate electrode 3. In this example, the insulating layer 4b is formed out of an $SiN_x$ film (with a thickness of about 325 nm) and the insulating layer 4c is formed out of an $SiO_2$ film (with a thickness of about 50 nm). The insulating layers 4b and 4c may be made of $SiO_2$, $SiN_x$, $SiO_xN_y$ (silicon oxynitride, where x>y), $SiN_xO_y$ (silicon nitride oxide, where x>y), $Al_2O_3$, or $Ta_2O_5$, for example.

Subsequently, as shown in FIG. 4(e), an oxide semiconductor film 5' is formed by sputtering process over the insulating layer 4c. As the oxide semiconductor film 5', an IGZO based semiconductor film was used. The oxide semiconductor film 5' may have a thickness of about 50 nm.

Thereafter, a conductive film (not shown) to be source and drain electrodes 6s and 6d is formed by sputtering process over the oxide semiconductor film 5'. Next, the conductive film and the oxide semiconductor film 5' are patterned simultaneously by photolithographic process using a half-tone mask, dry etching process and asking process, thereby turning the oxide semiconductor film 5' into an intended shape and forming source and drain electrodes 6s and 6d. Since the source and drain electrodes 6s and 6d can be formed and the oxide semiconductor film 5' can be patterned in this manner using a single photomask, the manufacturing process can be simplified and the manufacturing cost can be cut down. The source and drain electrodes 6s and 6d may have a multilayer structure consisting of Ti, Al and Ti layers, for example. The lower Ti layer may have a thickness of about 50 nm, the Al layer may have a thickness of about 200 nm, and the upper Ti layer may have a thickness of about 100 nm.

Subsequently, as shown in FIG. 4(f), an insulating protective layer 8 is formed by sputtering and photolithographic processes so as to cover the channel region of the oxide semiconductor film 5'. The insulating protective layer 8 may be made of an oxide (such as $SiO_2$), for example, and may have a thickness of about 150 nm. Also, when viewed along a normal to the substrate 1, an end portion of the insulating protective layer 8 suitably overlaps with the drain electrode 6d. Then, a portion of the oxide semiconductor film 5' which is located under the end portion of the drain electrode 6d can also be subjected to the resistance lowering process L to be described later.

Thereafter, a portion of the oxide semiconductor film 5' is subjected to the resistance lowering process L. The rest of the oxide semiconductor film 5' which is covered with the source and drain electrodes 6s, 6d and the insulating protective layer 8b is not subjected to the resistance lowering process L. As a result, as shown in FIG. 1(b), that portion of the oxide semiconductor film 5' that has been subjected to the resistance lowering process L turns into a second transparent electrode 7, while the other portion that has not been subjected to the resistance lowering process L turns into an oxide semiconductor layer 5. Naturally, the electrical resistance of that portion subjected to the resistance lowering process L is lower than that of the other portion not subjected to the resistance lowering process L. The resistance lowering process L may be plasma processing or doping a p-type impurity (such as B (boron)) or an n-type impurity (such as P (phosphorus)), for example. If an impurity doping process is adopted as the resistance lowering process L, then the impurity concentration of the second transparent electrode 7 becomes higher than that of the oxide semiconductor layer 5. Also, due to diffusion of the impurity, a portion of the oxide semiconductor film 5' which is located under the drain electrode 6d may sometimes have its resistance lowered and form part of the second transparent electrode 7. Examples of alternative resistance lowering processes L include hydrogen plasma processing using a CVD system, argon plasma processing using an etching system, and an annealing process under a reducing ambient.

Figure 5:
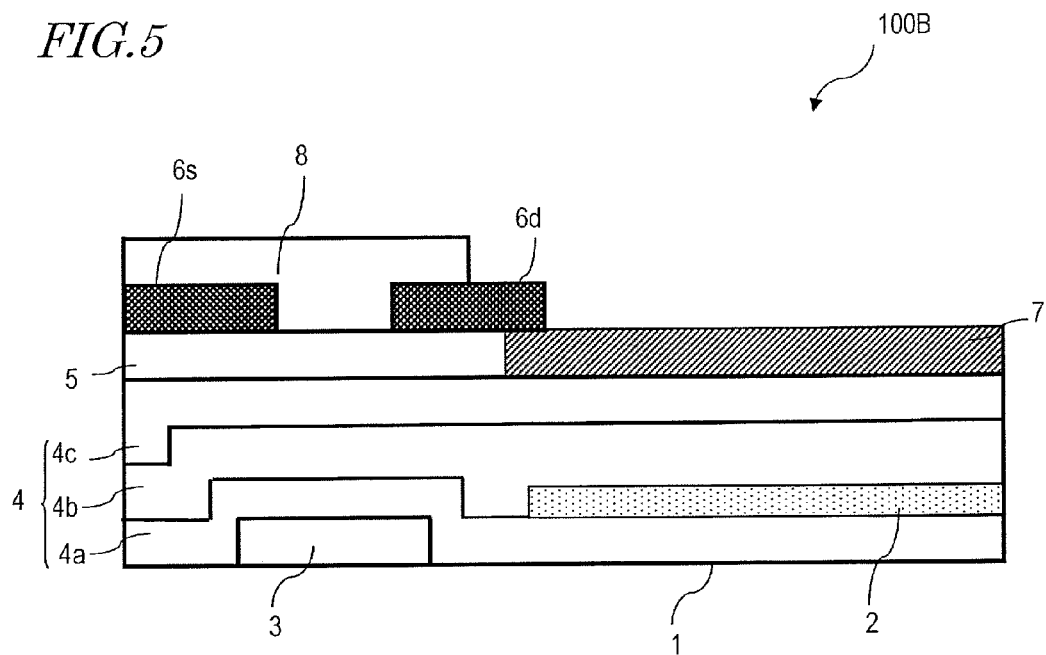
FIG. 5 A schematic cross-sectional view of a TFT substrate 100B according to another embodiment of the present invention.

Hereinafter, a TFT substrate 100B according to another embodiment of the present invention will be described with reference to FIG. 5, which is a schematic cross-sectional view of the TFT substrate 100B and which corresponds to the cross-sectional view of the TFT substrate 100A shown in FIG. 1(b). In FIG. 5, any component also included in the TFT substrate 100A and having substantially the same function as its counterpart is identified by the same reference numeral and its description will be omitted herein to avoid redundancies.

In the TFT substrate 100B shown in FIG. 5, the gate electrode 3 is located closer to the substrate than the first transparent electrode 2 is. This TFT substrate 100B includes the gate electrode 3 that has been formed on the substrate 2, an insulating layer 4a which has been formed over the gate electrode 3, and the first transparent electrode 2 that has been formed on the insulating layer 4a. In this TFT substrate 100B, the insulating layers 4a to 4c function as a gate insulating layer 4.

Figure 6:
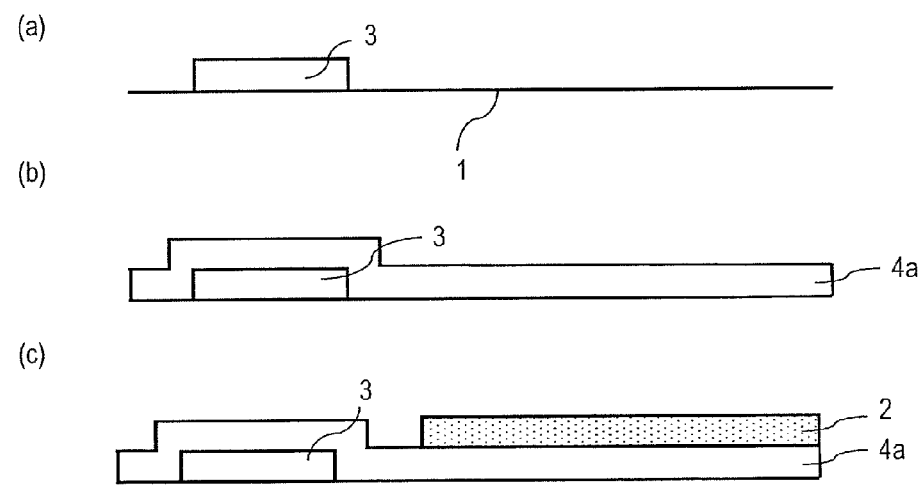
FIG. 6 (a) to (c) are schematic cross-sectional views illustrating respective manufacturing process steps to fabricate the TFT substrate 100B according to the embodiment of the present invention.

Hereinafter, an exemplary method for fabricating this TFT substrate 100B will be described with reference to FIG. 6. Specifically, FIGS. 6(a) and 6(b) are schematic cross-sectional views illustrating respective manufacturing process steps to fabricate the TFT substrate 100B.

First of all, as shown in FIG. 6(a), a gate electrode 3 is formed on a substrate 1 by the method described above.

Next, as shown in FIG. 6(b), an insulating layer 4a is deposited over the gate electrode 3 by the method described above.

Subsequently, as shown in FIG. 6(c), a first transparent electrode 2 is formed by the method described above. It should be noted that when viewed along a normal to the substrate 1, the gate electrode 3 and the first transparent electrode 2 do not overlap with each other.

Thereafter, insulating layers 4b and 4c, an oxide semiconductor film 5', source and drain electrodes 6s and 6d, a second transparent electrode 7, and an insulating protective layer 8 are formed by the methods described above (see FIGS. 4(d) to 4(f)). In this manner, the TFT substrate 100B shown in FIG. 5 is fabricated.

As can be seen from the foregoing description, an embodiment of the present invention provides a TFT substrate which can be fabricated by a simpler process and which can contribute to realizing a display device with higher definition and a higher aperture ratio than conventional ones and also provides a method for fabricating such a TFT substrate.

INDUSTRIAL APPLICABILITY

Embodiments of the present invention are applicable broadly to various types of devices that use a thin-film transistor. Examples of such devices include circuit boards such as an active-matrix substrate, display devices such as a liquid crystal display, an organic electroluminescence (EL) display, and an inorganic electroluminescence display, image capture devices such as an image sensor, and electronic devices such as an image input device and a fingerprint scanner.

REFERENCE SIGNS LIST 1 substrate
2 first transparent electrode
3 gate electrode
3' gate line
4a insulating layer
4b insulating layer
4c insulating layer
4 gate insulating layer
5 oxide semiconductor layer
6s source electrode
6d drain electrode
7 second transparent electrode
8 interlayer insulating layer
100A semiconductor device (TFT substrate)

The invention claimed is:
1. A semiconductor device comprising:
a substrate;
a gate electrode provided on the substrate;
a second insulating layer which is provided over the gate electrode;
a first transparent electrode provided on the second insulating layer;
a first insulating layer provided over the second insulating layer and the first transparent electrode;
an oxide semiconductor layer provided on the first insulating layer;
source and drain electrodes electrically connected to the oxide semiconductor layer; and
a second transparent electrode electrically connected to the drain electrode, wherein
at least a portion of the oxide semiconductor layer overlaps with the gate electrode with the first insulating layer and the second insulating layer interposed between them, at least a portion of the first transparent electrode overlaps with the second transparent electrode with the first insulating layer interposed between them, and the oxide semiconductor layer and the second transparent electrode are made from the same oxide film.

2. The semiconductor device of claim 1, wherein the drain electrode is provided on the second transparent electrode, and the second transparent electrode contacts directly with the drain electrode.

3. The semiconductor device of claim 1 or 2, wherein the second transparent electrode contains an impurity at a higher concentration than the oxide semiconductor layer.

4. The semiconductor device of claim 1, further comprising an insulating protective layer provided over the source and drain electrodes,
wherein the insulating protective layer contacts with a channel region of the oxide semiconductor layer, and the insulating protective layer is made of an oxide.

5. The semiconductor device of claim 1, wherein the first insulating layer includes an oxide insulating layer, and the oxide insulating layer contacts with the oxide semiconductor layer.

6. The semiconductor device of claim 1, wherein the same oxide film includes In, Ga and Zn.

7. The semiconductor device of claim 1, wherein the oxide semiconductor layer includes an In—Ga—Zn—O based semiconductor.

* * * * *